United States Patent [19]

Watanabe

[11] Patent Number: 5,463,240
[45] Date of Patent: Oct. 31, 1995

[54] CMIS DEVICE WITH INCREASED GAIN

[75] Inventor: Toshio Watanabe, Tokyo, Japan

[73] Assignee: NEC Corporation, Japan

[21] Appl. No.: 333,048

[22] Filed: Nov. 1, 1994

[30] Foreign Application Priority Data

Nov. 1, 1993 [JP] Japan .................................. 5-273343

[51] Int. Cl.$^6$ ........................... H01L 27/08; H01L 29/78; H03K 17/16; H03K 5/13
[52] U.S. Cl. .................. 257/369; 257/204; 257/206; 257/393; 257/401; 326/63; 326/68; 326/121; 327/437
[58] Field of Search .................... 257/368, 369, 257/393, 401, 204, 206; 326/63, 68, 121; 327/437

[56] References Cited

U.S. PATENT DOCUMENTS

| | | | |
|---|---|---|---|
| 4,701,643 | 10/1987 | Laude et al. | 326/117 |
| 4,823,176 | 4/1989 | Baliga et al. | 257/401 |
| 5,175,445 | 12/1992 | Kinugasa et al. | 326/121 |
| 5,291,083 | 3/1994 | Blalock et al. | 327/284 |

FOREIGN PATENT DOCUMENTS 4-157763  5/1992  Japan .................................. 257/369

OTHER PUBLICATIONS

S. A. Steiner et al., "High–Performance Column Driver for Gray–Scale TFEL Displays", SID 88 Digest, pp. 31–34, 1988.

*Primary Examiner*—Mahshid D. Saadat
*Attorney, Agent, or Firm*—Ostrolenk, Faber, Gerb & Soffen

[57] ABSTRACT

In a CMIS device having a semiconductor substrate including a first N-type region and a P-type region, a second P-type region is formed within the first N-type region, and a second N-type region is formed within the first P-type region. Also, a third N-type region is formed within the second P-type region, and a third N-type region is formed within the second N-type region. An N-channel transistor is formed by the first N-type region as a drain, the second P-type region as a channel, and the third N-type region as a source. A P-channel transistor is formed by the first P-type region as a drain, the second N-type region as a channel, and the third P-type region as a source.

12 Claims, 8 Drawing Sheets

5,463,240

CMIS DEVICE WITH INCREASED GAIN

BACKGROUND OF THE INVENTION

1. Field of the Invention

The present invention relates to a semiconductor device, and more particularly, to a complementary metal oxide semiconductor (CMOS, broadly, CMIS) device used in an output circuit of a simiconductor integrated cirucit (IC).

2. Description of the Related Art

In semiconductor IC's, a prior art output circuit uses an inverter or a source follower cirucit having an active load. In this prior art output circuit, however, a current steadily flows, which thereby increases the power consumption. Also, the driving power is low due to the limitation of a current flowing through the active load.

In order to reduce the power consumption as well as enhance the driving power, CMOS source follower circuits have been used in output circuits of semiconductor IC's.

A prior art CMOS source follower circuit is comprised of a semiconductor substrate partitioned by a P-type region and a N-type region. Formed in the P-type region are N-type regions as source and a drain for an N-channel enhancement-type transistor. Also, formed in the P-type region are N-type regions as a source and a drain for an N-channel enhancement-type transistor. The drain of the N-channel transistor is connected to a power supply terminal $V_{DD}$ having a voltage of +10 V, for example, and the drain of the P-channel transistor is connected to a power supply terminal $V_{SS}$ whose voltage, for example −10 V, is lower than that of the terminal $V_{DD}$. Also, gate electrodes of the N-channel transistor and the P-channel transistor are connected commonly to an input node. Further, the sources of the N-chapel transistor and the P-channel transistor are connected commonly to an output node.

Also, the channel of the N-channel transistor is connected to the power supply terminal $V_{SS}$, i.e., the back bias voltage of the N-channel transistor is $V_{SS}$. On the other hand, the channel of the P-channel transistor is connected to the output node, i.e., the back bias voltage of the P-channel transistor is a voltage at the output node. This will be explained later in detail.

In the above-mentioned prior art CMOS source follower circuit, however, when the voltage at the input node is positively large, the threshold voltage of the N-channel transistor is enlarged due to the fact that the channel (back bias) voltage of the N-channel transistor is fixed at $V_{SS}$, and the source voltage of the N-channel transistor is increased with respect to the back bias voltage $V_{SS}$. As a result, the gain of the CMOS source follower circuit is reduced in the case where the voltage at the input node is large.

Also, in the input/output characteristics of the above-mentioned prior art CMOS source follower circuit, there is a dead gap voltage region where the voltage at the output node is zero when the voltage at the input node is within a range, so that the distortion of the input/output characteristics is large.

SUMMARY OF THE INVENTION

It is an object of the present invention to provide a CMOS device (source follower circuit) having an increased gain.

Another object is to reduce the dissipation of the input/output characteristics in the CMIS device (source follower circuit).

According to the present invention, in a CMIS device having a semiconductor substrate including a first N-type region and a P-type region, a second P-type region is formed within the first N-type region, and a second N-type region is formed within the first P-type region. Also, a third N-type region is formed within the second P-type region, and a third P-type region is formed within the second N-type region. An N-channel transistor is formed by the first N-type region as a drain, the second P-type region as a channel, and the third N-region as a source. A P-channel transistor is formed by the first P-type region as a drain, the second N-type region as a channel, and the third P-type region as a source. As a result, the threshold voltage of the N-channel transistor depending upon the difference between the back bias voltage at the second P-type region and the source voltage at the third P-type region is definite, and therefore, the gain is increased.

Also, in the present invention, an input voltage is shifted up by a definite value and is applied to a gate electrode of the N-channel transistor, and simultaneously, the input voltage is shifted down by a definite value and is applied to a gate electrode of the P-channel transistor. As a result, the dead gap voltage region is reduced or extinguished in the input/output characteristics, to thereby reduce the distortion thereof.

BRIEF DESCRIPTION OF THE DRAWINGS

The present invention will be clearly understood from the description as set forth below, as compared with the prior art, with reference to the accompanying drawings, wherein.

DESCRIPTION OF THE PREFERRED EMBODIMENTS

Before the description of the preferred embodiments, a prior art CMOS devices will be explained with reference to FIGS. 1 through 3.

Figure 1:
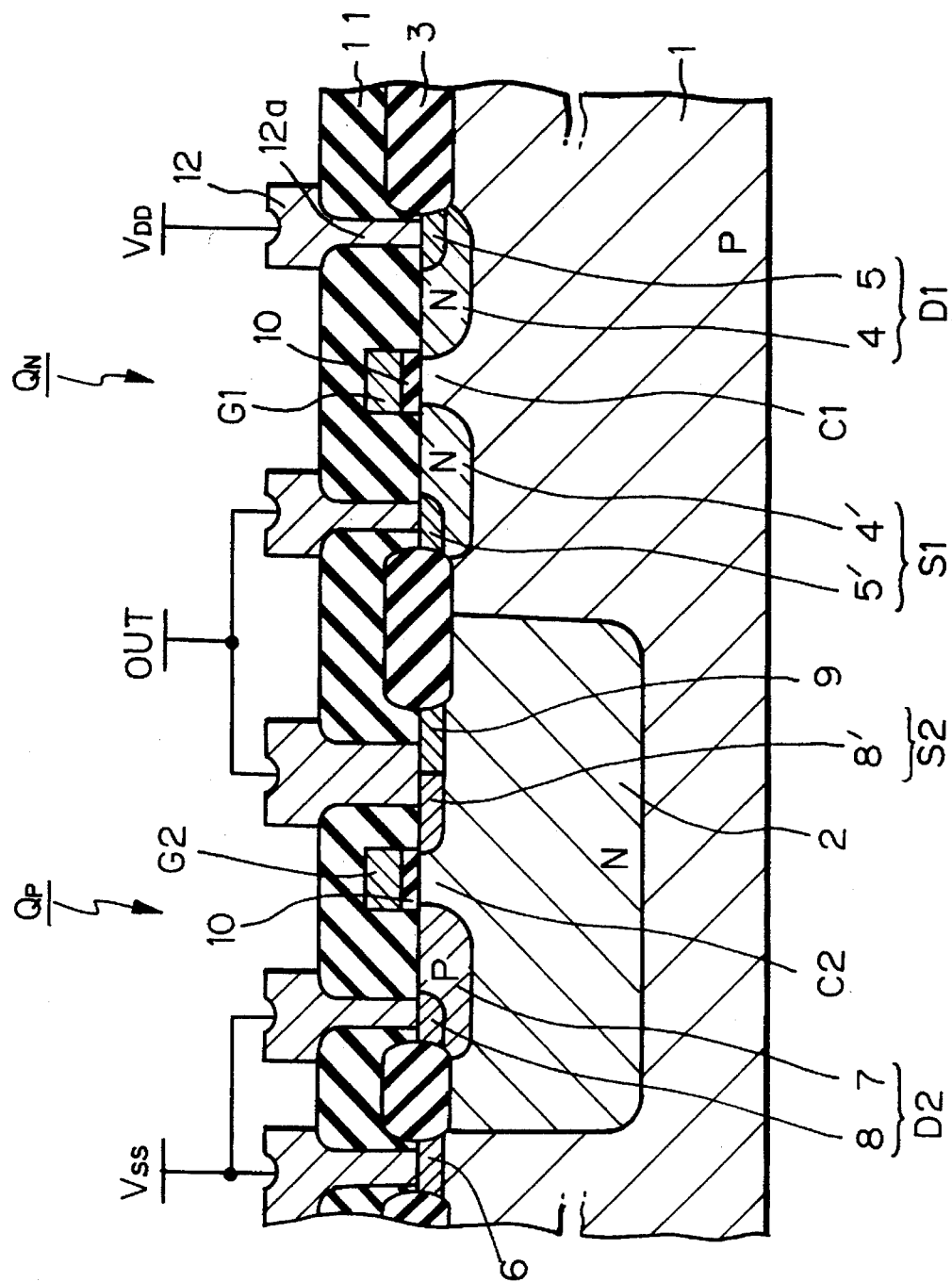
FIG. 1 is a cross-sectional view illustrating a prior art CMOS device.

In FIG. 1, which is a cross-sectional view illustrating a prior art CMOS device, reference 1 designates a P-type semiconductor substrate in which an N-type well region 2 is formed. A thick field silicon oxide layer 3 partitions the semiconductor substrate 1 and the N-type well region 2, i.e., partitions an area for forming an N-channel enhancement-type transistor $Q_N$ and an area for forming a P-channel enhancement-type transistor $Q_P$.

Provied in the area for forming the N-channel transistor $Q_N$ are an offset-type drain region D1 formed by an N-type region 4 and an N$^+$-type region 5, an offset-type source region S1 formed by an N-type region 4' and an N$^+$-type region 5', a channel region C1 at an interface of the P-type semiconductor substrate 1 between the drain region D1 and the source region S1, and a P$^+$-type contact region 6.

Similarly, provided in the area for forming the N-channel transistor $Q_P$ are an offset-type drain region D2 formed by a P-type region 7 and a P$^+$-type region 8, source region S2 formed by a P-type region 8', a channel region C2 at an interface of the N-type well 2 between the drain region D2 and the source region S2, and an N$^+$-type contact region 9.

Also, provided on the semiconductor substrate 1 and the N-type well 2 are a gate silicon oxide layer 10, a polycrystalline silicon gate electrode G1 formed above the channel region C1, a polycrystalline silicon gate electrode G2 formed above the channel region C2, an insulating layer 11, and an aluminum connection layer 12 formed within contact holes 12a formed in the insulating layer 11.

Figure 2:
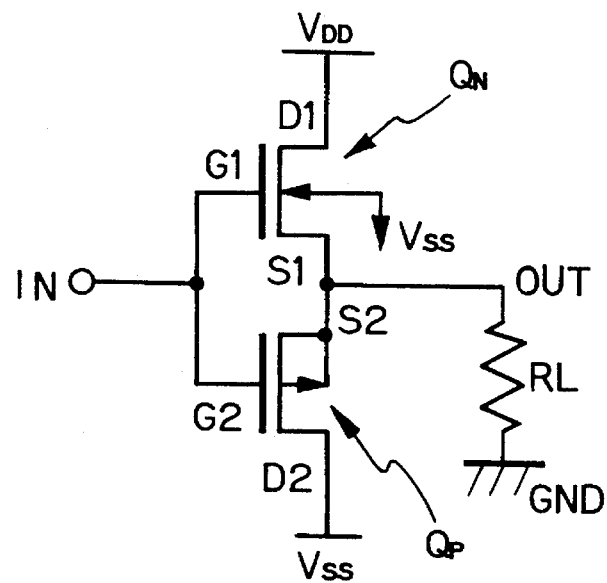
FIG. 2 is an equivalent circuit diagram of the device of FIG. 1.

In FIG. 1, with reference to FIG. 2, which is an equivalent circuit diagram of the device of FIG. 1, the drain region D1 of the N-channel transistor $Q_N$ is connected to a positive power supply terminal $V_{DD}$ whose voltage is +10 V, for example. Also, the source region S1 of the N-channel transistor $Q_N$, the source region S2 of the P-channel transostor $Q_P$, and the P$^+$-type contact region 6 are connected to an output node OUT which is connected to an external load RL. Further, the drain region D2 of the P-channel transistor $Q_P$ is connected to a negative power supply terminal $V_{SS}$ whose voltage is −10 V, for example. Further, the gate electrodes G1 and G2 are connected commonly to an input node IN.

Figure 3:
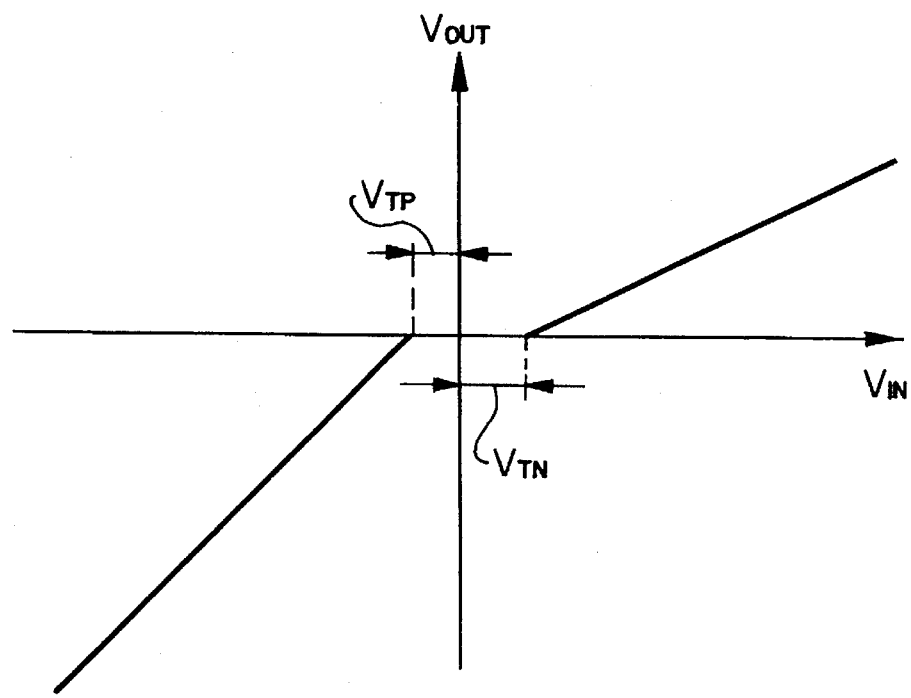
FIG. 3 is a graph showing the input/output characteristics of the device of FIG. 1.

The input/output characteristics of the device of FIG. 1 are shown in FIG. 3. That is, when a voltage $V_{IN}$ at the input node IN and a voltage $V_{OUT}$ at the output node OUT are both negative, the operation of the device of FIG. 1 is dependent upon that of the P-channel transistor $Q_P$, so that there is no problem with respect to the gain. On the other hand, when the voltage $V_{IN}$ and the voltage $V_{OUT}$ are both positive, the operation of the device of the FIG. 1 is dependent upon that of the N-channel transistor $Q_N$, so that there is a problem with respect to the gain. That is, in the N-channel transistor $Q_N$, since the back bias voltage thereof is applied from the P$^+$-type contact region 6, and therefore is fixed at the negative voltage $V_{SS}$, a threshold voltage $V_{TN}$ of the N-channel transistor $Q_N$ is enlarged. In addition, when the input voltage $V_{IN}$ is higher, the output voltage $V_{OUT}$ is higher, so that the source voltage of the N-channel transistor $Q_N$ is higher. Thus, the threshold voltage $V_{TN}$ of the N-channel transistor $Q_N$ is enlarged by a back gate effect. For example, the threshold voltage $V_{TN}$ of the N-channel transistor $Q_N$ is +4.3 V, while a threshold voltage $V_{TP}$ of the P-channel transistor $Q_P$ is −1.0 V. Therefore, the gain of the N-channel transistor $Q_N$ is reduced, i.e., the gain of the device of FIG. 1 is reduced in a region where the input voltage $V_{IN}$ and the output voltage $V_{OUT}$ are positive.

Also, as shown in FIG. 3, there is a dead gap voltage region. That is, when the input voltage $V_{IN}$ is within from $V_{TP}$ to $V_{TN}$, for example, within −1.0 V to +4.3 V, the output voltage $V_{OUT}$ is zero, thus increasing the distortion of the input/output characteristics.

In FIG. 1, note that it is impossible to connect the P$^+$-type contact region 6 to the output node OUT special for the N-channel transistor $Q_N$, since many active elements N-channel transistors other than the N-channel transistor $Q_N$ are usually formed in the semiconductor substrate 1.

Also, in FIG. 1, if the region 1 is formed by a P-type well and the region 2 is formed by a N-type semiconductor substrate, the back bias voltage of the N-channel trasistor $Q_N$ can be $V_{OUT}$, but, in this case, the back bias voltage of the P-channel transistor $Q_P$ is fixed at a definite voltage such as $V_{DD}$. As a result, the gain of the P-channel transistor $Q_P$ is reduced, i.e., the gain of the device is reduced in a region where the input voltage $V_{IN}$ and the output voltage $V_{OUT}$ are negative.

Figure 4:
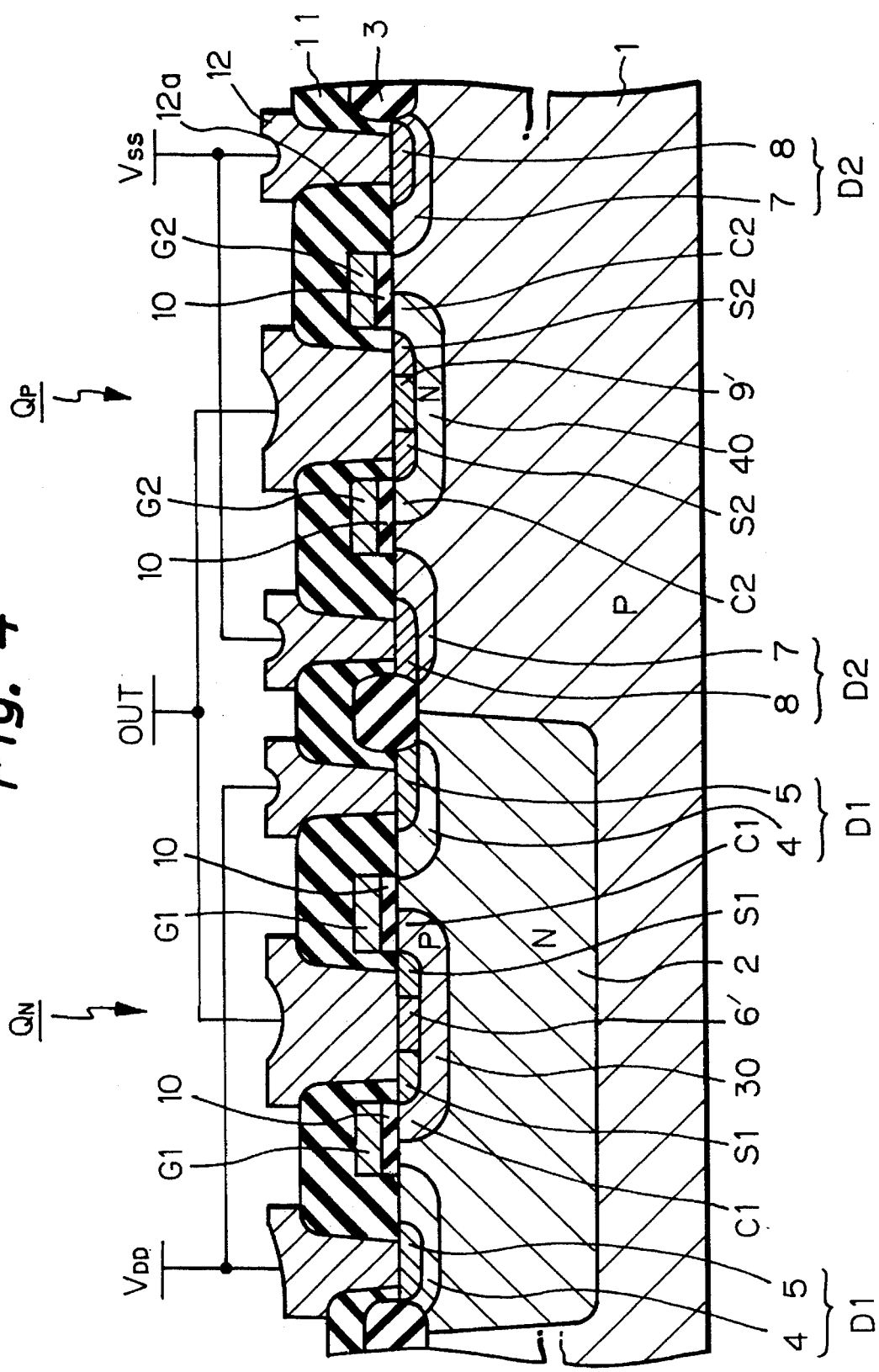
FIG. 4 is a cross-sectional view illustrating a first embodiment of the CMOS device according to the present invention.

In FIG. 4, which illustrates a first embodiment of the present invention, the N-channel transistor $Q_N$ is formed in the N-type well 2, and the P-channel transistor $Q_P$ is formed in the P-type semiconductor substrate 1.

Provided in the area for forming the N-channel transistor $Q_N$ are an offset type drain region D1 formed by an N-type region 4 and an N$^+$-type region 5, a P-type region 30 for defining a channel region C1 at an interface thereof, an N$^+$-type source region S1, and a P$^+$-type contact region 6'. In this case, the N$^+$-type source region S1 and the P$^+$-type contact region 6' are manufactured in self-alignment with the polycrystalline silicon gate electrode G1, and therefore, form a double self-alignment (DSA) structure.

Similarly, provided in the area for forming the P-channel transistor $Q_P$ are an offset type drain region D2 formed by a P-type region 7 and a P$^+$-type region 8, an N-type region 40 for defining a channel region C2 at an interface thereof, a P$^+$-type source region S2, and an N$^+$-type contact region 9'. In this case, the P$^+$-type source region S2 and the N$^+$-type contact region 9' are manufactured in self-alignment with the polycrystalline silicon gate electrode G2, and therefore, form a DSA structure.

Also, provided on the N-type well 2 and the semiconductor substrated 1 are a gate silicon oxide layer 10, a polycrystalline silicon gate electrode G1 formed above the channel region C1, a polycrystalline silicon gate electrode G2 formed above the channel region C2, an insulating layer 11, and an aluminum connection layer 12 formed within contact holes 12a formed in the insulating layer 11.

Figure 5A:
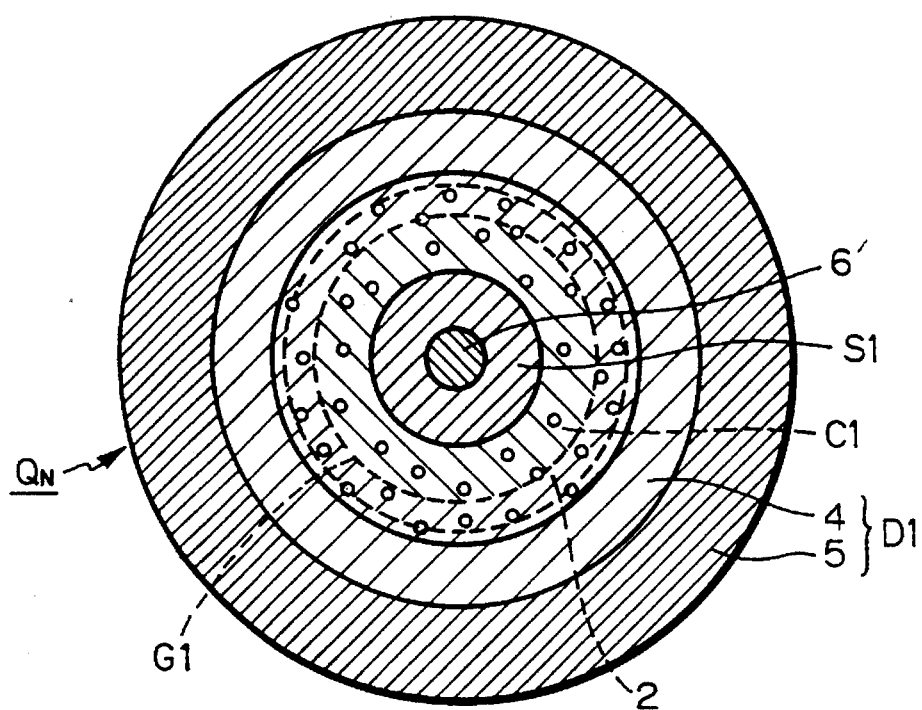
FIGS. 5A and 5B are plan views of the N-channel transistor and the P-channel transistor, respectively, of FIG. 4.

As illustrated in FIG. 5A, which is a plan view of the N-channel transistor $Q_N$ of FIG. 4, the P+-type contact region 6' is cylindrical, and the source region S1 is of a ring shape surrounding the P$^+$-type contact region 6'. Further, the channel region C1 is also of a ring shape surrounding the source region S1. Also, the drain region D1 is of a ring shape surrounding the channel region C1.

Figure 5B:
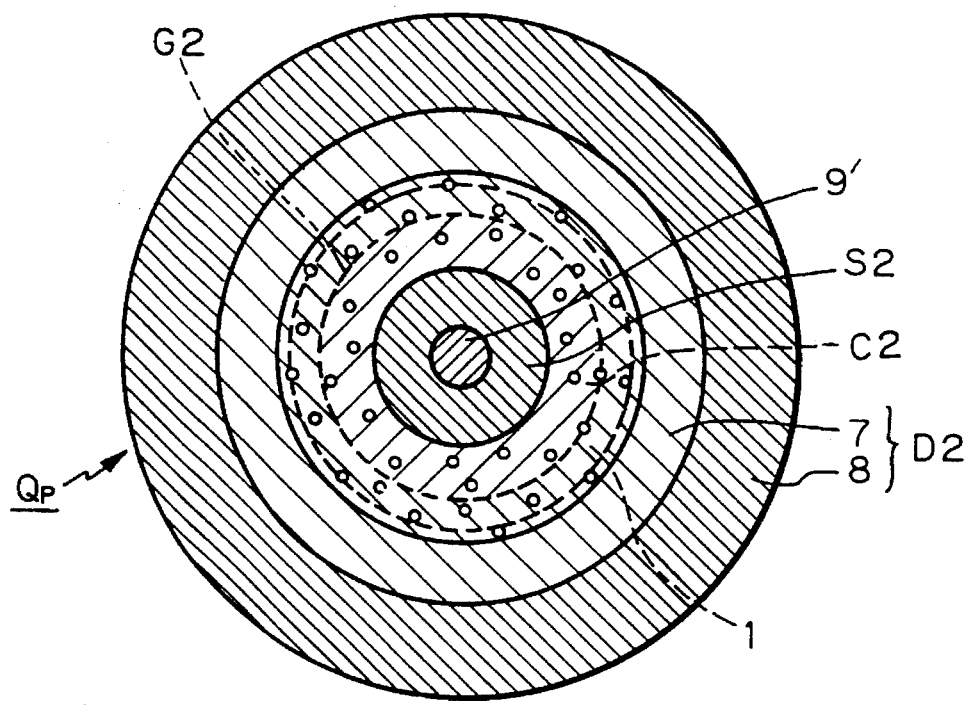

Similarly, as illustrated in FIG. 5B, which is a plan view of the P-channel transistor $Q_P$ of FIG. 4, the N$^+$-type contact region 9' is cylindrical, and the source region S2 is of a ring shape surrounding the N$^+$-type contact region 9'. Further, the channel region C2 is also of a ring shape surrounding the source region S2. Also, the drain region D2 is of a ring shape surrounding the channel region C2.

Figure 6:
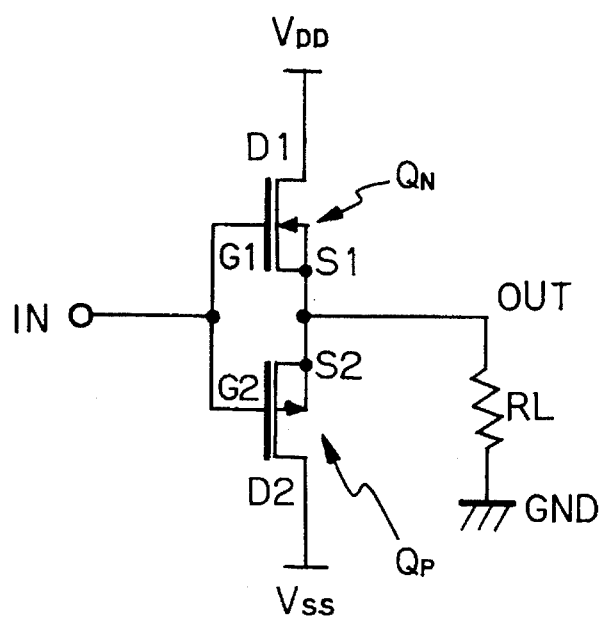
FIG. 6 is an equivalent circuit diagram of the device of FIG. 4.

In FIG. 4, with reference to FIG. 6, which is an equivalent circuit diagram of the device of FIG. 4, the P-type region 30 of the N-channel transistor $Q_N$ as well as the N-type region 40 of the P-channel transistor $Q_P$ is connected to the output node OUT. That is, the P-type region 30 is connected via the P$^+$-type region 6' to the output node OUT, and the N-type region 40 is connected via the N$^+$-type region 9' to the output node OUT. Therefore, the back gate voltages of the N-channel transistor $Q_N$ and the P-channel transistor $Q_P$ are both $V_{OUT}$. As a result, even in the N-channel transistor $Q_N$, the threshold voltage $V_{TN}$ depending the source voltage and the back gate voltage thereof becomes small and is definite regardless of the output voltage $V_{OUT}$.

Figure 7:
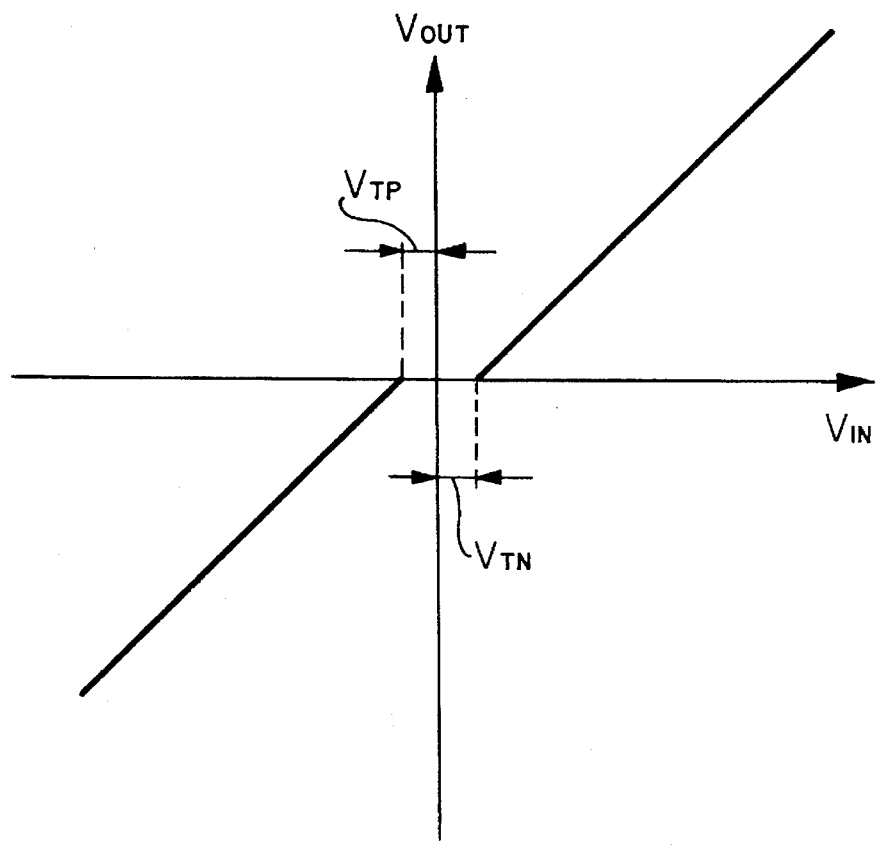
FIG. 7 is a graph showing the input/output characteristics of the device.

The input/output characteristics of the device of FIG. 4 are shown in FIG. 7. That is, when the input voltage $V_{IN}$ and the voltage $V_{OUT}$ are both negative, the operation of the device of FIG. 4 is dependent upon that of the P-channel transistor $Q_P$, so that the input/output characteristics are the same as that of FIG. 3. For example, the threshold voltage $V_{TP}$ of the P-channel transistor $Q_P$ is −1.0 V. On the other hand, when the voltage $V_{IN}$ and the voltage $V_{OUT}$ are both positive, the operation of the device of FIG. 4 is dependent upon that of the N-channel transistor $Q_N$. In this case, the threshold voltage $V_{TN}$ of the N-channel transistor $Q_N$ is definite and small, for example, 1.0 V. Therefore, as shown in FIG. 7, the gain is increased.

Also, since the threshold voltage $V_{TN}$ is reduced, the dead gap voltage region defined by the input voltage $V_{IN}$ from $V_{TP}$ to $V_{TN}$ is reduced from a range from −1.0 V to +4.3 V to a range from −1.0 V to +1.0 V. Thus, the distortion of the input/output characteristics can be reduced.

Figure 8:
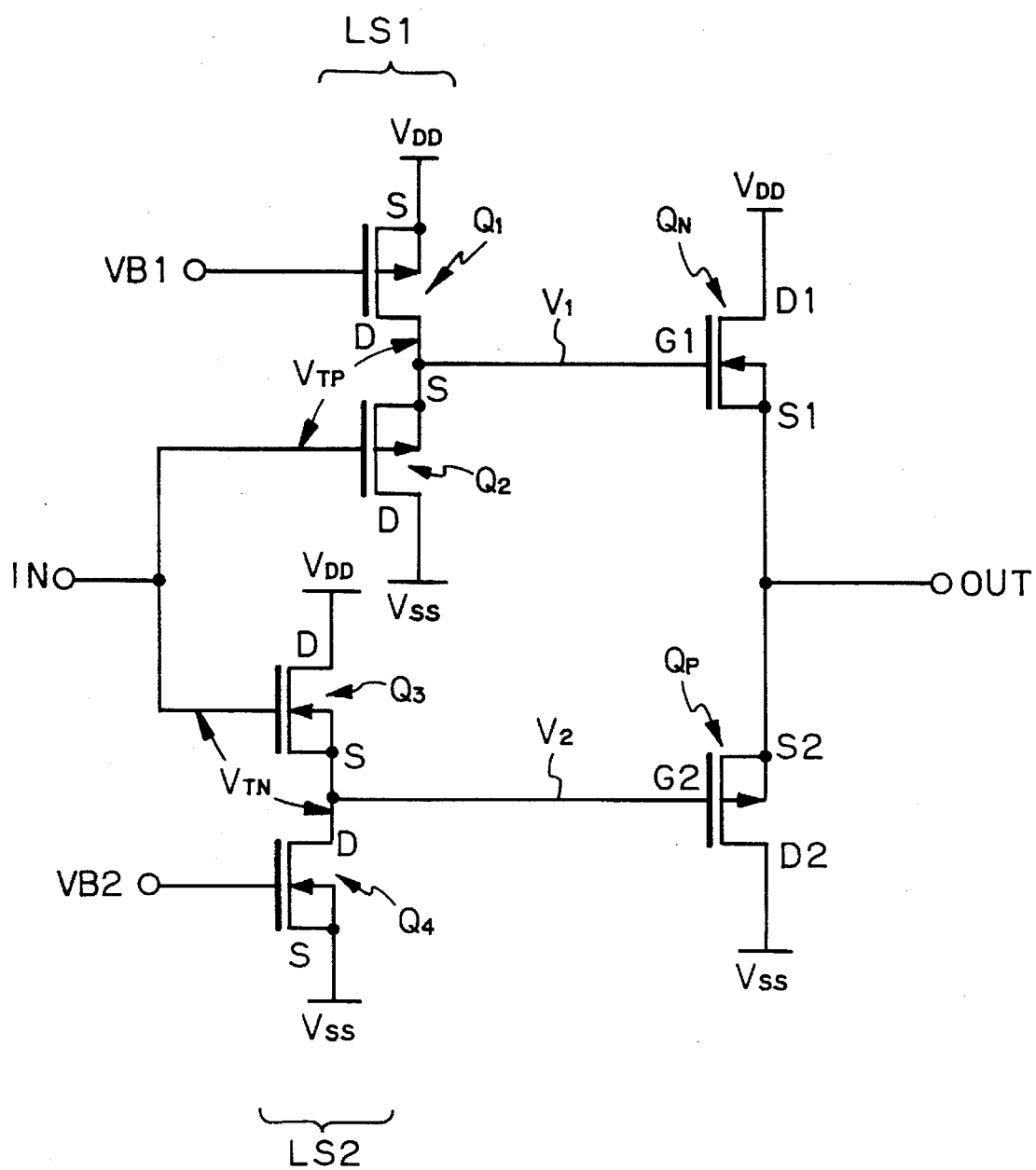
FIG. 8 is a circuit diagram illustrating a second embodiment of the CMOS device according to the present invention.

In FIG. 8, which illustrates a second embodiment of the present invention, a level shifter circuit LS1 is provided between the input node IN and the gate electrode G1 of the N-channel transistor $Q_N$ of FIG. 6. Also, a level shifter circuit LS2 is provided between the input node IN and the gate electrode G2 of the N-channel transistor $Q_P$ of FIG. 6.

Figure 9A:
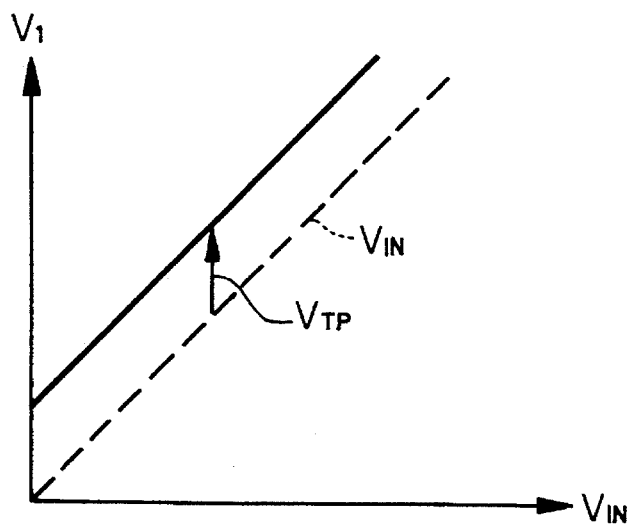
FIGS. 9A, 9B and 9C are diagrams showing the operation of the device of FIG. 8.

The level shifter cirucit LS1 shifts up the input voltage $V_{IN}$ by a definite value such as $V_{TP}$. This level shifter circuit LS1 includes a P-channel transistor $Q_1$ have the same configuration as the P-channel transistor $Q_P$ of FIG. 1, and a P-channel transistor $Q_2$ having the same configuration of the P-channel transistor $Q_P$ of FIG. 4. In this case, a definite voltage VB1 is applied to a gate electrode of the transistor $Q_1$, and therefore, the transistor $Q_1$ serves as an active load. The transistor $Q_2$ serves as a source follower, and therefore, the transistor $Q_2$ generates a voltage $V_1$ higher than the input voltage $V_{IN}$ by the value $V_{TP}$ as shown in FIG. 9A.

Figure 9B:
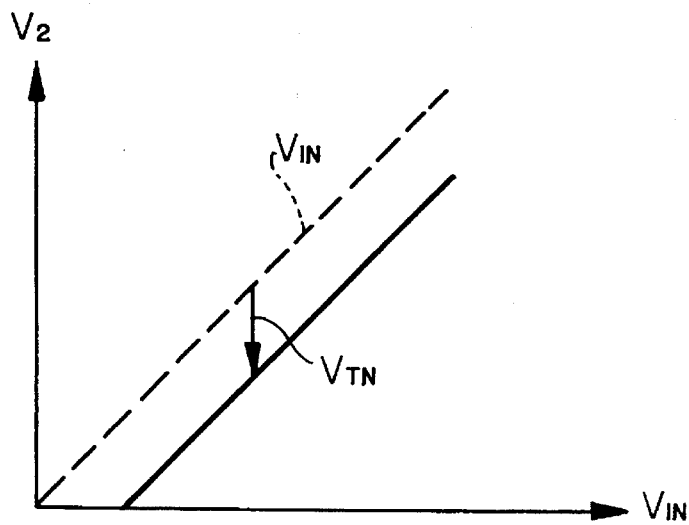

The level shifter circuit LS2 shifts down the input voltage $V_{IN}$ by a definite value such as $V_{TN}$. This level shifter circuit LS2 includes an N-channel transistor $Q_3$ having the same configuration as the P-channel transistor $Q_N$ of FIG. 4, and an N-channel transistor $Q_4$ having the same configuration of the P-channel transistor $Q_N$ of FIG. 1. In this case, a definite voltage VB2 is applied to a gate electrode of the transistor $Q_4$, and therefore, the transistor $Q_4$ serves as an active load. The transistor $Q_3$ serves as a source follower, and therefore, the transistor $Q_3$ generates a voltage $V_2$ lower than the input voltage $V_{IN}$ by the value $V_{TN}$ as shown in FIG. 9B.

Figure 9C:
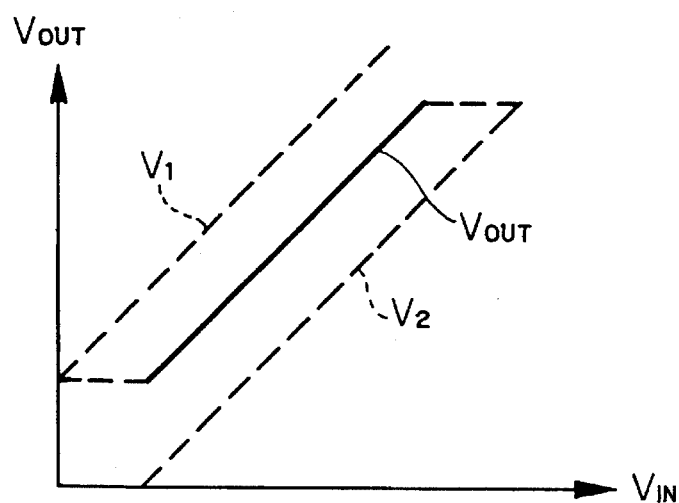

Thus, a difference in potential of about $V_{TN}+ V_{TP}$ is generated between the gate electrode G1 of the N-channel transistor $Q_N$ and the gate electrode G2 of the P-channel transistor $Q_P$. As a result, as shown in FIG. 9C, the gain is about 1.

Figure 10:
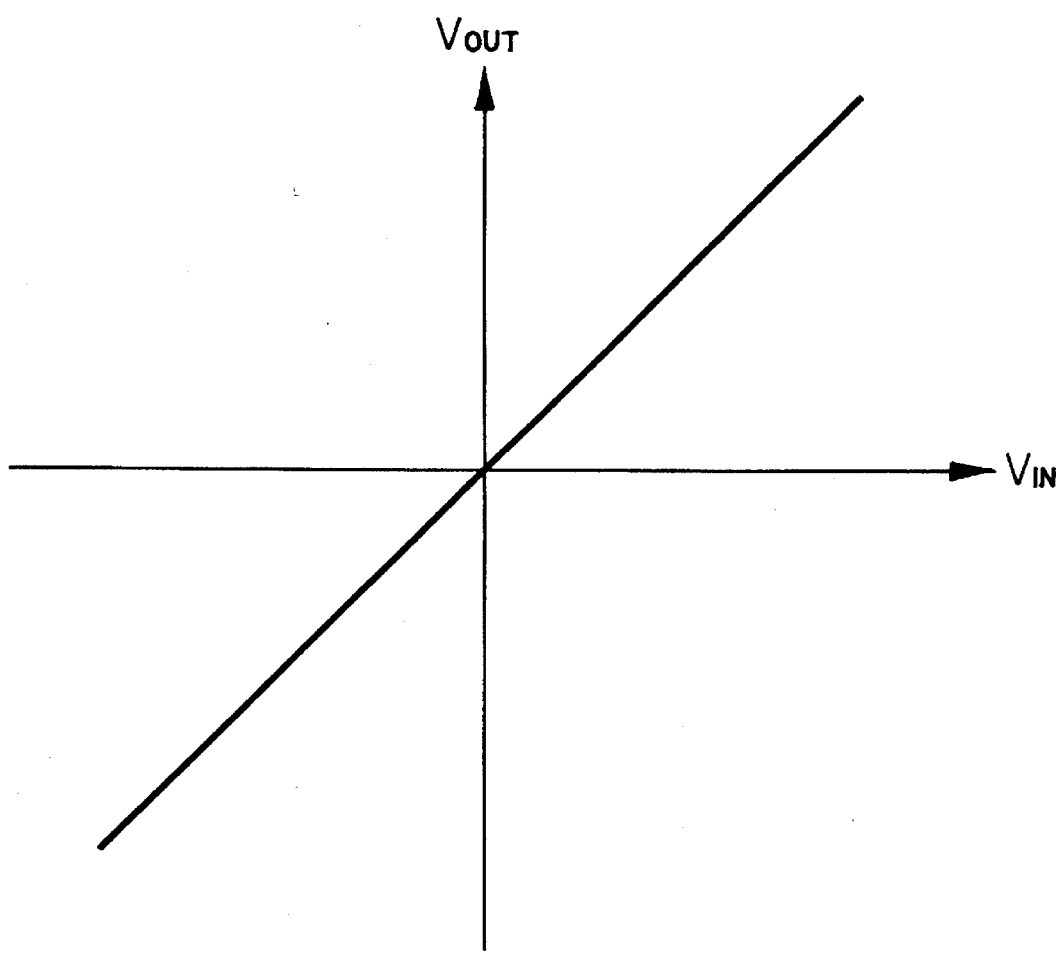
FIG. 10 is a graph showing the input/output characteristics of the device of FIG. 8.

In more detail, the pinch off point of the N-channel transistor $Q_n$ regarding the input voltage $V_{IN}$ approximately coincides with that of the P-channel transistor $Q_P$ regarding the input voltage $V_{IN}$, and as a result, the distortion of the input/output characteristics is extinguished as shown in FIG. 10.

As explained hereinbefore, according to the present invention, since each threshold voltage of the transistors of a CMIS source follower circuit can be definite and small, the gain can be increased. Also, the distortion of the input/output characteristics can be reduced or extinguished.

I claim:

1. A CMIS device comprising:

a semiconductor substrate including a first N-type region for a drain of an N-channel transistor and a first P-type region for a drain of a P-channel transistor;

a second P-type region formed within said first N-type region, a surface of said second P-type region being for a channel of said N-channel transistor;

a second N-type region formed within said first P-type region, a surface of said second N-type region being for a channel of said P-channel transistor;

a third N-type region formed within said second P-type region, said third N-type region being for a source of said N-channel transistor;

a third P-type region formed within said second N-type region, said third P-type region being for a source of said P-channel transistor;

a first gate electrode formed above said second P-type region;

a second gate electrode formed above said second N-type region;

said first N-type region being connected to a first power supply means for receiving a first voltage;

said first P-type region being connected to a second power supply means for receiving a second voltage lower than the first voltage;

means for connecting said second P-type region, said second N-type region, said third N-type region and said third P-type region to each other.

2. A device as set forth in claim 1, wherein said second P-type region is of a ring shape surrounding said third N-type region, said first N-type region being of a ring shape surrounding said second P-type region, said first gate electrode being of a ring shape, said second N-type region is of a ring shape surrounding said third P-type region, said first P-type region being of a ring shape surrounding said second N-type region, said second gate electrode being of a ring shape.

3. A device as set forth in claim 1, further comprising:

a P-type contact region formed within said third N-type region and connected to said second P-type region; and an N-type contact region formed within said third P-type region and connected to said second P-type region, said connecting means being connected via said P-type contact region to said second P-type region and via said N-type contact region to said second N-type region.

4. A device as set forth in claim 3, further comprising an insulating layer formed on said semiconductor substrate, said insulating layer having a first contact hole commonly for said third N-type region and said P-type contact region and a second contact hole commonly for said third P-type region and said N-type contact region, said connecting means comprising a metal connection layer formed within said first and second contact holes.

5. A device as set forth in claim 3, wherein said P-type contact region and said N-type contact region are cylindrical.

6. A device as set forth in claim 1, further comprising:

an input node connected to said first and second gate electrodes; and an output node connected to said connecting means.

7. A device as set forth in claim 1, wherein said first N-type region and said first P-type region are of an offset type drain structure.

8. A CMIS device comprising:

a first power supply means for receiving a first voltage;

a second power supply means for receiving a second voltage lower than the first voltage;

an input node;

an output node;

an N-channel enhancement-type transistor having a drain region connected to said first power supply means, a source region connected to said output node, a channel region connected to said output node, and a gate electrode connected to said input node; and a P-channel enhancement-type transistor having a drain region connected to said second power supply means, a source region connected to said output node, a channel region connected to said output node, and a gate electrode connected to said input node.

9. A device as set forth in claim 8, further comprising:

a first level shifter circuit, connected between said input node and the gate electrode of said N-type enhancement-type transistor, for shifting up a voltage at said input node by a first definite value; and a second level shifter circuit, connected between said input node and the gate electrode of said N-type enhancement-type transistor, for shifting down the voltage at said input node by a second definite value.

10. A device as set forth in claim 9, wherein said first level shifter comprises:

a first load element connected to said first power supply means; and a P-channel source follower, connected between said first load element and said second power supply means, for shifting up the voltage at said input node by the first value.

11. A device as set forth in claim 9, wherein said second level shifter comprises:

a second load element connected to said second power supply means; and an N-channel source follower, connected between said second load element and said first power supply means, for shifting down the voltage at said input node by the second value.

12. A CMIS device comprising:

a semiconductor substrate including a first N-type region for a drain of an N-channel transistor and a first P-type region for a drain of a P-channel transistor;

a second P-type region formed within said first N-type region, a surface of said second P-type region being for a channel of said N-channel transistor;

a second N-type region formed within said first P-type region, a surface of said second N-type region being for a channel of said P-channel transistor;

a third N-type region formed within said second P-type region, said third N-type region being for a source of said N-channel transistor;

a third P-type region formed within said second N-type region, said third P-type region being for a source of said P-channel transistor;

a first gate electrode formed above said second P-type region; and a second gate electrode formed above said second N-type region.

* * * * *